(12) United States Patent  
Konaka

(10) Patent No.: US 10,411,674 B2  
(45) Date of Patent: Sep. 10, 2019

(54) ELASTIC WAVE DEVICE, DUPLEXER, AND MULTIPLEXER

(71) Applicant: Murata Manufacturing Co., Ltd., Nagaokakyo-shi, Kyoto-fu (JP)

(72) Inventor: Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 140 days.

(21) Appl. No.: 15/290,098

(22) Filed: Oct. 11, 2016

(65) Prior Publication Data

US 2017/0149410 A1 May 25, 2017

(30) Foreign Application Priority Data

Nov. 19, 2015 (JP) ................................. 2015-226928

(51) Int. Cl.
*H03H 9/64* (2006.01)
*H03H 9/02* (2006.01)
(Continued)

(52) U.S. Cl.
CPC ...... *H03H 9/6433* (2013.01); *H03H 9/02905* (2013.01); *H03H 9/02992* (2013.01);
(Continued)

(58) Field of Classification Search
CPC ........... H03H 9/02842; H03H 9/02905; H03H 9/02992; H03H 9/56; H03H 9/643;
(Continued)

(56) References Cited

U.S. PATENT DOCUMENTS

| 6,552,475 B2 * | 4/2003 | Hori | H03H 3/08 310/364 |
| 7,112,913 B2 * | 9/2006 | Shimoe | H03H 3/08 310/313 B |

(Continued)

FOREIGN PATENT DOCUMENTS

| CN | 1497846 A | 5/2004 |
| JP | 04-063010 A * | 2/1992 |

(Continued)

OTHER PUBLICATIONS

English language machine translation of JP 08-265099 A, published Oct. 11, 1996, 6 pages.*

(Continued)

*Primary Examiner* — Barbara Summons
(74) *Attorney, Agent, or Firm* — Keating & Bennett, LLP

(57) ABSTRACT

An elastic wave device includes first and second longitudinally coupled resonator elastic wave elements aligned on a piezoelectric substrate. A second reflector of the first longitudinally coupled resonator elastic wave element and a third reflector of the second longitudinally coupled resonator elastic wave element are adjacent to each other in an elastic wave propagation direction. A ground interconnection extends in a direction intersecting with the elastic wave propagation direction and in a region between the second reflector and the third reflector. A gap in one portion of the ground interconnection includes a different acoustic velocity portion where an acoustic velocity is different from an acoustic velocity in another portion of the ground interconnection.

15 Claims, 6 Drawing Sheets

(51) Int. Cl.
*H03H 9/72* (2006.01)
*H03H 9/56* (2006.01)
*H03H 9/70* (2006.01)

(52) U.S. Cl.
CPC ........ *H03H 9/6473* (2013.01); *H03H 9/6476* (2013.01); *H03H 9/6489* (2013.01); *H03H 9/725* (2013.01); *H03H 9/56* (2013.01); *H03H 9/70* (2013.01)

(58) Field of Classification Search
CPC .. H03H 9/6473; H03H 9/6476; H03H 9/6489; H03H 9/70; H03H 9/725; H03H 9/6433; H03H 9/644
USPC ............................. 333/133, 195; 310/313 D
See application file for complete search history.

(56) References Cited

U.S. PATENT DOCUMENTS

| | | | | |
|---|---|---|---|---|
| 7,541,722 B2* | 6/2009 | Ishiura | ................... | H03H 3/08 310/313 R |
| 7,579,928 B2* | 8/2009 | Otsuka | ................ | H03H 9/0047 310/313 B |
| 7,902,716 B2* | 3/2011 | Tanaka | ................ | H03H 9/0038 310/313 B |
| 7,902,940 B2* | 3/2011 | Takamine | ............ | H03H 9/0057 333/133 |
| 2004/0075511 A1* | 4/2004 | Inoue | ................. | H03H 9/02685 333/133 |
| 2005/0156687 A1* | 7/2005 | Matsuda | ............ | H03H 9/02771 333/195 |
| 2011/0102108 A1 | 5/2011 | Fukuda | | |

FOREIGN PATENT DOCUMENTS

JP          08-265099 A   * 10/1996
WO       2009/150786 A1   12/2009

OTHER PUBLICATIONS

English language machine translatoin of JP 04-063010 A, published Feb. 28, 1992, 3 pages.*
English language translation of the Official Communication issued in Chinese Patent Application No. 201610957605.9, dated Jul. 3, 2019.
Official Communication issued in Chinese Patent Application No. 201610957605.9, dated Jul. 3, 2019.

* cited by examiner

ELASTIC WAVE DEVICE, DUPLEXER, AND MULTIPLEXER

CROSS REFERENCE TO RELATED APPLICATIONS

This application claims the benefit of priority to Japanese Patent Application 2015-226928 filed on Nov. 19, 2015, and the entire contents of this application are hereby incorporated herein by reference.

BACKGROUND OF THE INVENTION

1. Field of the Invention

The present invention relates to elastic wave devices including a plurality of longitudinally coupled resonator elastic wave elements, and duplexers as well as multiplexers including the elastic wave devices.

2. Description of the Related Art

Various types of filter devices and the like using longitudinally coupled resonator elastic wave elements have been proposed. In an elastic wave device disclosed in International Publication No. WO 2009/150786, a first longitudinally coupled resonator elastic wave filter and a second longitudinally coupled resonator elastic wave filter are disposed on a piezoelectric substrate. The first longitudinally coupled resonator elastic wave filter and the second longitudinally coupled resonator elastic wave filter are aligned so that elastic wave propagation regions thereof overlap with each other when viewed in an elastic wave propagation direction. Further, the first longitudinally coupled resonator elastic wave filter and the second longitudinally coupled resonator elastic wave filter are connected in parallel. Furthermore, a ground interconnection is provided in a region between reflectors at a side where the first and second longitudinally coupled resonator elastic wave filters are adjacent to each other.

The elastic wave device disclosed in International Publication No. WO 2009/150786 is also required to be small in size like other electronic components. To meet this requirement, it is necessary to shorten a distance between the reflectors adjacent to each other of the first and second longitudinally coupled resonator elastic wave filters.

Meanwhile, because waves cannot be completely confined in the longitudinally coupled resonator elastic wave filter, the waves leak to an outer side portion in the elastic wave propagation direction beyond the reflector in some cases. As such, the waves leaked from the first longitudinally coupled resonator elastic wave filter toward the second longitudinally coupled resonator elastic wave filter side interfere with the waves leaked from the second longitudinally coupled resonator elastic wave filter toward the first longitudinally coupled resonator elastic wave filter side. In this case, as a distance between the first and second resonator elastic wave filters is shorter, influence of the interference of the waves as unwanted modes becomes larger.

The reflector can be designed to prevent the generation of an unwanted mode, that is, a high order longitudinal mode positioned on a lower frequency side of the pass band, for example. In such case, however, it is difficult to obtain steepness on the lower frequency side of the pass band.

SUMMARY OF THE INVENTION

Preferred embodiments of the present invention provide an elastic wave device that significantly reduces or prevents the influence of unwanted modes.

Preferred embodiments of the present invention also provide an elastic wave device, a duplexer, and a multiplexer as band pass filters that significantly reduce or prevent the influence of unwanted modes and provide steepness on a lower frequency side of the pass band.

According to a preferred embodiment of the present invention, an elastic wave device includes a piezoelectric substrate; a first longitudinally coupled resonator elastic wave element that is provided on the piezoelectric substrate and includes a plurality of interdigital transducer (IDT) electrodes, a first reflector disposed on one side, in an elastic wave propagation direction, of a portion where the plurality of IDT electrodes are provided, and a second reflector disposed on the other side, in the elastic wave propagation direction, of the portion where the plurality of IDT electrodes are provided; a second longitudinally coupled resonator elastic wave element that is aligned with the first longitudinally coupled resonator elastic wave element along the elastic wave propagation direction on the piezoelectric substrate and includes a plurality of IDT electrodes, a third reflector disposed on one side, in the elastic wave propagation direction, of a portion where the plurality of IDT electrodes are provided, and a fourth reflector disposed on the other side, in the elastic wave propagation direction, of the portion where the plurality of IDT electrodes are provided; and a ground interconnection provided on the piezoelectric substrate and electrically connected to the first and second longitudinally coupled resonator elastic wave elements. The second reflector and the third reflector are adjacent to each other in the elastic wave propagation direction, and the ground interconnection is extended, in a direction intersecting with the elastic wave propagation direction, in a region between the second reflector and the third reflector; and in a portion, of a section of the ground interconnection that is extended to the region between the second reflector and the third reflector, that overlaps with an elastic wave propagation region of the first and second longitudinally coupled resonator elastic wave elements when viewed in the elastic wave propagation direction, there is provided a different acoustic velocity portion in which an acoustic velocity is different from an acoustic velocity in the remaining portion of the above-mentioned section.

In a preferred embodiment of the present invention, the ground interconnection includes a first interconnection layer that is continuously connected to the second reflector and the third reflector and fills or substantially fills the region between the second reflector and the third reflector.

In another preferred embodiment of the present invention, the ground interconnection includes a second interconnection layer, in the region between the second reflector and the third reflector, that is laminated on the first interconnection layer and is not continuously connected to the second or third reflectors, and in the second interconnection layer, there is provided a portion as the different acoustic velocity portion whose dimension along the elastic wave propagation direction is smaller than the remaining portion in the second interconnection layer. In this case, by providing a portion whose dimension along the elastic wave propagation direction is relatively small in comparison with the remaining portion in the second interconnection layer, a different acoustic velocity portion is able to be provided with ease.

In still another preferred embodiment of the present invention, a dimension of the different acoustic velocity portion along the elastic wave propagation direction is 0, and the different acoustic velocity portion includes a gap dividing the second interconnection layer. In this case, by depositing the second interconnection layer so that it includes the above-mentioned gap, the different acoustic velocity portion is able to be provided with ease. In addition, a difference in acoustic velocity between the different acoustic velocity portion and the other portion is able to be sufficiently large.

In a further preferred embodiment of the present invention, further provided is a mass addition member that is partially laminated, in a direction intersecting with the elastic wave propagation direction, within a portion of the ground interconnection which is extended to a region between the second reflector and the third reflector and overlaps with the elastic wave propagation region in the elastic wave propagation direction, and the mass addition member includes the different acoustic velocity portion. In this case, by including various kinds of materials as the mass addition member, the different acoustic velocity portion is able to be easily provided.

In yet another preferred embodiment of the present invention, the first and second longitudinally coupled resonator elastic wave elements are first and second longitudinally coupled resonator elastic wave filters. In this case, because the influence of unwanted modes is significantly reduced or prevented not by the design of the reflectors, but by the different acoustic velocity portion, it is possible to significantly reduce or prevent the unwanted modes and obtain steepness on the lower frequency side of the pass band at the same time.

In another preferred embodiment of the present invention, the elastic wave device is a band pass filter in which the first and second longitudinally coupled resonator elastic wave filters are connected in parallel.

A duplexer according to a further preferred embodiment of the present invention includes a reception filter and a transmission filter, and at least one of the reception filter and the transmission filter is a band pass filter including the elastic wave device according to one of the other preferred embodiments of the present invention.

A multiplexer according to a further preferred embodiment of the present invention includes a plurality of band pass filters, and at least one of the band pass filters includes the elastic wave device according to one of the other preferred embodiments of the present invention.

With the elastic wave devices according to preferred embodiments of the present invention, influence of unwanted modes is significantly reduced or prevented. Further, in the case where the first and second longitudinally coupled resonator elastic wave filters are a band pass filter according to various preferred embodiments of the present invention, it is possible to significantly reduce or prevent the influence of unwanted modes and obtain steepness on the lower frequency side of the pass band at the same time.

The above and other elements, features, steps, characteristics and advantages of the present invention will become more apparent from the following detailed description of preferred embodiments with reference to the attached drawings.

DETAILED DESCRIPTION OF THE PREFERRED EMBODIMENTS

Hereinafter, the present invention will be clarified through description of specific preferred embodiments of the present invention with reference to the drawings.

It is to be noted that the preferred embodiments described in this specification are merely examples, and that the configurations in the preferred embodiments are able to be partly replaced or combined between different preferred embodiments.

Figure 1:
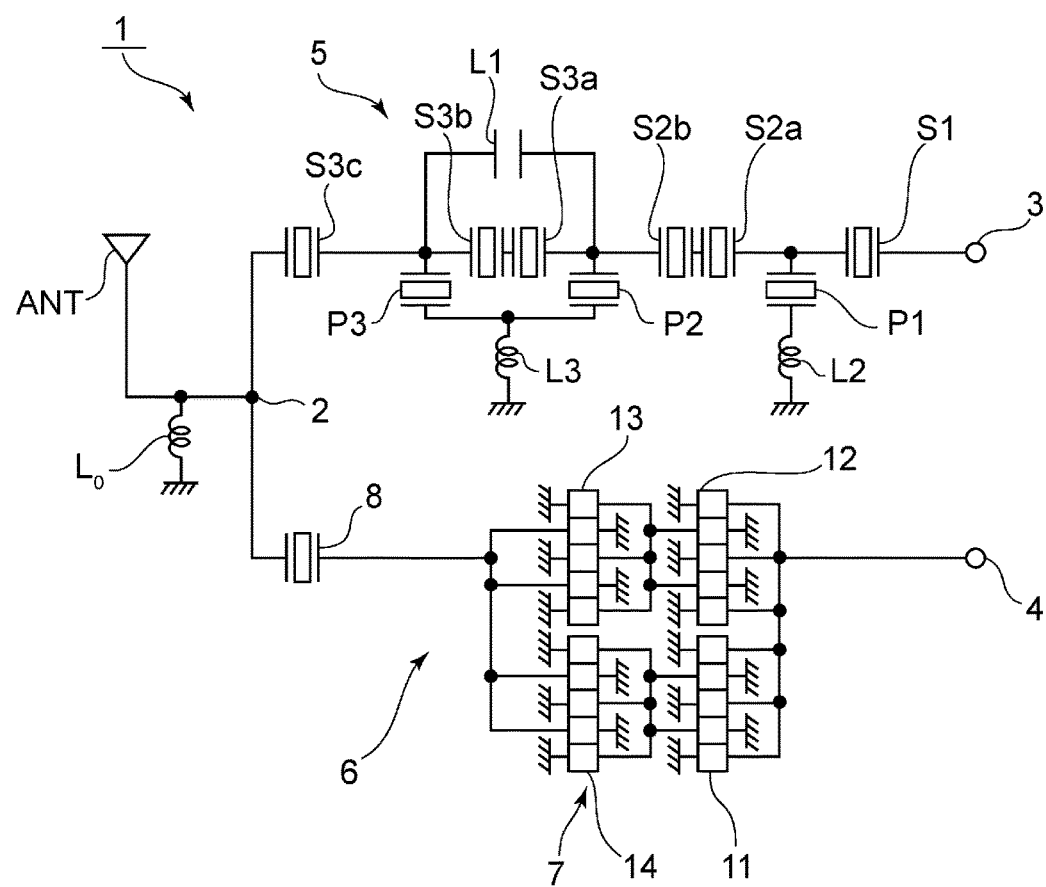
FIG. 1 is a circuit diagram of a duplexer according to a preferred embodiment of the present invention.

FIG. 1 is a circuit diagram of a duplexer according to a first preferred embodiment of the present invention.

A duplexer 1 includes an antenna terminal 2, a transmission terminal 3, and a reception terminal 4. The antenna terminal 2 is electrically connected to an antenna ANT. An impedance matching inductance $L_0$ is connected between the antenna terminal 2 and a ground potential. A transmission filter 5 is connected between the antenna terminal 2 and the transmission terminal 3. A reception filter 6 is connected between the antenna terminal 2 and the reception terminal 4.

The reception filter 6 includes a longitudinally coupled resonator elastic wave filter unit 7. A serial arm resonator 8 including an elastic wave resonator is connected between the longitudinally coupled resonator elastic wave filter unit 7 and the antenna terminal 2.

The longitudinally coupled resonator elastic wave filter unit 7 includes first and second longitudinally coupled resonator elastic wave filters 11, 12 and third and fourth longitudinally coupled resonator elastic wave filters 13, 14. The first and second longitudinally coupled resonator elastic wave filters 11 and 12 are connected to the reception terminal 4. The third and fourth longitudinally coupled resonator elastic wave filters 13 and 14 are respectively connected to end portions of the first and second longitudinally coupled resonator elastic wave filters 11 and 12 on the opposite side to the reception terminal 4. Each of the first through fourth longitudinally coupled resonator elastic wave filters 11 through 14 preferably is a five-IDT longitudinally coupled resonator elastic wave filter, for example. In FIG. 1, each single IDT of the first through fourth longitudinally coupled resonator elastic wave filters 11 through 14 is indicated by a substantially rectangular block. Although not shown in FIG. 1, reflectors are disposed on both sides, in the elastic wave propagation direction, of a region where five IDTs are aligned.

Features of the duplexer 1 can be recognized in a portion where the first and second longitudinally coupled resonator elastic wave filters 11 and 12 are provided in the longitudinally coupled resonator elastic wave filter unit 7. This will be more specifically described with reference to FIG. 2 and FIGS. 3A and 3B.

Figure 2:
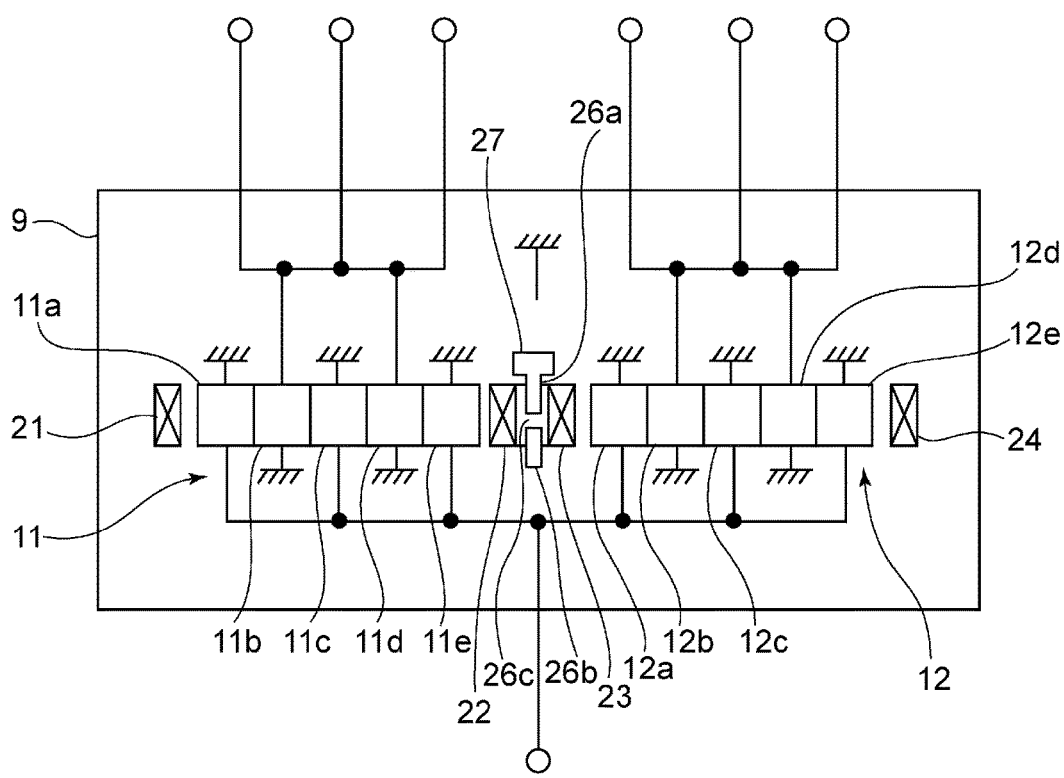
FIG. 2 is a schematic plan view illustrating a configuration in which first and second longitudinally coupled resonator elastic wave filters are connected to each other in parallel in a reception filter of the duplexer according to a preferred embodiment of the present invention.

FIG. 2 is a schematic plan view illustrating a portion where the first and second longitudinally coupled resonator elastic wave filters 11 and 12 are provided on a piezoelectric substrate. The first and second longitudinally coupled resonator elastic wave filters 11 and 12 are provided on a piezoelectric substrate 9. The piezoelectric substrate 9 preferably includes a piezoelectric single crystal such as $LiTaO_3$, $LiNbO_3$, or the like. Alternatively, the piezoelectric substrate 9 may include piezoelectric films laminated on an insulative substrate.

Other elements included in the reception filter 6 as shown in FIG. 1 are also provided on the piezoelectric substrate 9. For example, the third and fourth longitudinally coupled resonator elastic wave filters 13 and 14, the serial arm resonator 8, and so on are also provided on the piezoelectric substrate 9. Note that, in FIG. 2, only the portion where the first and second longitudinally coupled resonator elastic wave filters 11 and 12 are provided is shown.

In the first longitudinally coupled resonator elastic wave filter 11, first through fifth IDTs 11a through 11e are included along the elastic wave propagation direction. A first reflector 21 is provided on one side, in the elastic wave propagation direction, of a portion where the first through fifth IDTs 11a through 11e are provided. A second reflector 22 is provided on the other side, in the elastic wave propagation direction, of the portion where the first through fifth IDTs 11a through 11e are provided.

The second longitudinally coupled resonator elastic wave filter 12 is aligned or substantially aligned with the first longitudinally coupled resonator elastic wave filter 11 in the elastic wave propagation direction. An elastic wave propagation region of the first longitudinally coupled resonator elastic wave filter 11 preferably overlaps with an elastic wave propagation region of the second longitudinally coupled resonator elastic wave filter 12 when viewed in the elastic wave propagation direction. Further, the first longitudinally coupled resonator elastic wave filter 11 and the second longitudinally coupled resonator elastic wave filter 12 are connected in parallel.

The second longitudinally coupled resonator elastic wave filter 12 also includes first through fifth IDTs 12a through 12e. A third reflector 23 is provided on one side, in the elastic wave propagation direction, of a portion where the first through fifth IDTs 12a through 12e are provided. A fourth reflector 24 is provided on the other side, in the elastic wave propagation direction, of the portion where the first through fifth IDTs 12a through 12e are provided.

The second reflector 22 and the third reflector 23 are adjacent to, or in the vicinity of, each other in the elastic wave propagation direction.

In FIG. 2, the first through fourth reflectors 21 through 24 are each indicated by a symbol in which two diagonal lines are added to an elongated or substantially elongated rectangle. A portion where the second reflector 22 and the third reflector 23 are close to each other is described below with reference to FIGS. 3A and 3B.

Figure 3A:
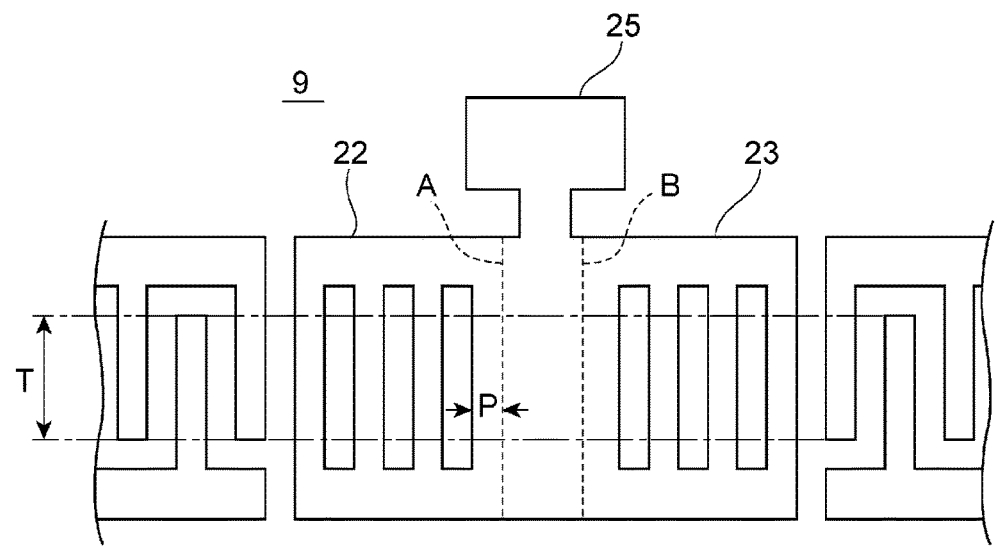
FIG. 3A is a partial cut-out plan view illustrating second and third reflectors and a first interconnection layer of a ground interconnection in a portion where the second and third reflectors are adjacent to each other between the first and second longitudinally coupled resonator elastic wave filters.
Figure 3B:
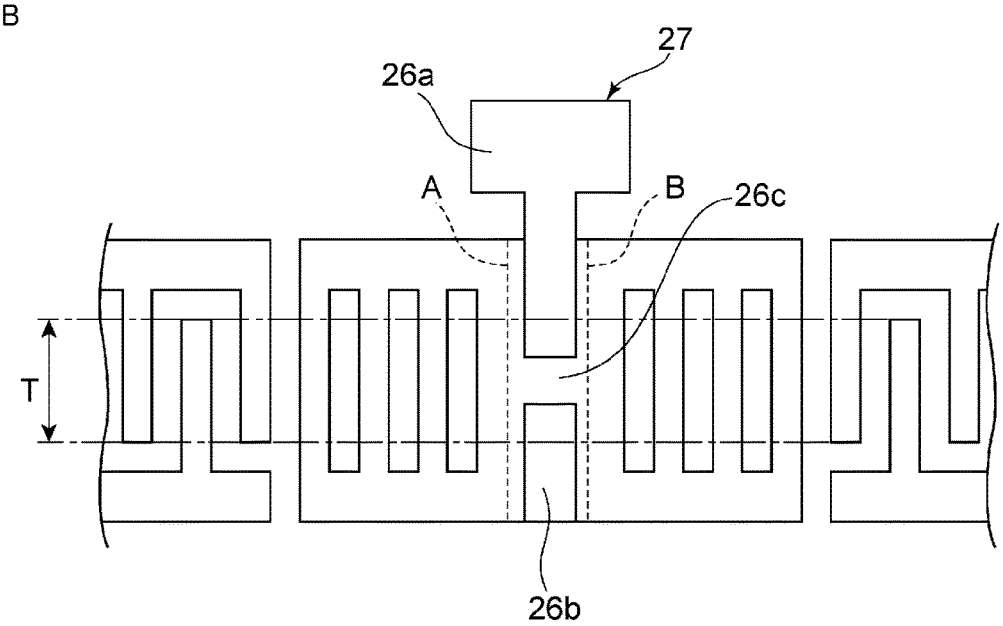
FIG. 3B is a partial cut-out enlarged plan view illustrating a state in which a second interconnection layer is laminated on the first interconnection layer shown in FIG. 3A.

An electrode structure as shown in FIG. 3A is obtained preferably by depositing a metal film as a first layer on the piezoelectric substrate 9 at the time of manufacturing the first longitudinally coupled resonator elastic wave filter 11 and the second longitudinally coupled resonator elastic wave filter 12. In other words, the first through fifth IDTs 11a through 11e and 12a through 12e of the first and second longitudinally coupled resonator elastic wave filters 11 and 12, and the first through fourth reflectors 21 through 24 are formed preferably by depositing the metal film. The second reflector 22 and the third reflector are continuously connected to each other through a first interconnection layer 25. Second interconnection layers 26a and 26b shown in FIG. 3B are deposited on the first interconnection layer 25. A ground interconnection 27 includes the first interconnection layer 25 and the second interconnection layers 26a, 26b.

The ground interconnection 27 is an interconnection connected to a ground potential. The first interconnection layer 25 of the ground interconnection 27 is continuously connected to the second reflector 22 and the third reflector 23. A broken line "A" shown in FIG. 3A indicates a boundary between the first interconnection layer 25 and the second reflector 22, while a broken line "B" shown in FIG. 3A indicates a boundary between the third reflector 23 and the first interconnection layer 25.

The ground interconnection 27 including the first interconnection layer 25 and the second interconnection layers 26a, 26b is extended to a region between the second reflector 22 and the third reflector 23, that is, a region between the broken line A and the broken line B, as shown in the drawings. Further, a gap 26c is provided between the second interconnection layer 26a and the second interconnection layer 26b.

The gap 26c defines a different acoustic velocity portion according to a preferred embodiment of the present invention. In other words, the gap 26c defining a different acoustic velocity portion is provided in a section of the ground interconnection 27 that extends to the region between the second reflector 22 and the third reflector 23 and overlaps with the elastic wave propagation region when viewed in the elastic wave propagation direction.

An acoustic velocity in a portion of the section overlapping with the elastic wave propagation region, where the gap 26c is provided, is faster than an acoustic velocity in the remaining portion of the above-mentioned section. The influence of unwanted modes is significantly reduced or prevented by a difference in acoustic velocity between the acoustic velocity in the portion where the gap 26c is provided and the acoustic velocity in the remaining portion, as described below.

In FIGS. 3A and 3B, a region indicated by an arrow mark "T" indicates the elastic wave propagation region. The elastic wave propagation region is an intersecting region in which electrode fingers connected to different potentials overlap with each other when viewed in the elastic wave propagation direction in the first and second longitudinally coupled resonator elastic wave filters 11 and 12.

In a longitudinally coupled resonator elastic wave element such as a longitudinally coupled resonator elastic wave filter, a reflector acts as capacitance in a frequency range outside the stop band. As such, elastic waves at a lower frequency than the stop band are not reflected but are allowed to pass through. Because of this, in a longitudinally coupled resonator elastic wave filter, for example, a high order longitudinal mode not including a pass band is generated in a frequency range lower than the pass band; however, the high order longitudinal mode cannot be reflected by the reflector. Accordingly, in the case where two longitudinally coupled resonator elastic wave filters are adjacent to or in the vicinity of each other, the generated high order longitudinal mode leaks to an adjacent longitudinally coupled resonator elastic wave filter. As such, the high order longitudinal mode becomes an unwanted mode which is likely to be generated in the attenuation band. Because of this, out-of-band attenuation cannot be made to be sufficiently large.

Meanwhile, the above-mentioned unwanted mode generated by the longitudinally coupled resonator elastic wave element is able to be reflected by raising a stop band frequency of the reflector. In such a case, steepness of the filter characteristics is degraded on a lower frequency side of the pass band because the stop band frequency of the reflector is raised. In other words, it has been difficult to achieve concurrently, both increasing the out-of-band attenuation and obtaining steepness on the lower frequency side of the pass band.

In the first preferred embodiment, unwanted modes cancel each other out by making use of an interference of both unwanted modes generated between the first and second longitudinally coupled resonator elastic wave filters 11 and 12. That is, in the region where the second and third reflectors 22 and 23 are adjacent to or in the vicinity of each other, the aforementioned acoustic velocity difference is generated between the gap 26c and the portion other than the gap 26c. This acoustic velocity difference causes the unwanted modes to cancel each other out, thus significantly reducing or preventing the influence of the unwanted modes.

In addition, because it is not necessary to design the second and third reflectors 22 and 23 so that the second and third reflectors 22 and 23 reflect the unwanted modes, steepness on the lower frequency side of the pass band is able to be provided. Accordingly, the increase in the out-of-band attenuation and steepness on the lower frequency side of the pass band are able to be realized at the same time.

The transmission filter 5 includes serial arm resonators S1, S2a, S2b, S3a, S3b, S3c and parallel arm resonators P1 through P3, which include elastic wave resonators. An inductance L1 is connected in parallel to the serial arm resonators S3a and S3b. An inductance L2 is connected between the parallel arm resonator P1 and the ground potential. End portions of the parallel arm resonators P2 and P3 on the ground potential side are connected to each other to provide a common connection portion, and an inductance L3 is connected between the common connection portion and the ground potential.

Based on a specific experimental example, as described below, according to the first preferred embodiment, the influence of unwanted modes is significantly reduced or prevented and the out-of-band attenuation in a lower frequency band than the pass band is able to be made to be sufficiently large.

The first and second longitudinally coupled resonator elastic wave filters 11 and 12, the third and fourth longitudinally coupled resonator elastic wave filters 13 and 14, and the serial arm resonator 8 are preferably manufactured, and then the filter characteristics were evaluated, as described below.

Respective numbers of pairs of electrode fingers of the first through fifth IDTs 11a through 11e and 12a through 12e of the first and second longitudinally coupled resonator elastic wave filters 11 and 12, and respective electrode finger pitches were set as shown in Table 1. Further, respective numbers of pairs of electrode fingers of the first through fifth IDTs of the third and fourth longitudinally coupled resonator elastic wave filters 13 and 14, and respective electrode finger pitches thereof were set as shown in Table 2. Note that the first through fifth IDTs had a small pitch portion at a section where the IDTs were adjacent to or in the vicinity of each other. In Tables 1 and 2, main electrode finger pitches and electrode finger pitches in the small pitch portions are indicated in the order along a direction from the first IDT up to the fifth IDT.

TABLE 1

| | First IDT 11a, 12a | Small Pitch Portion | Small Pitch Portion | Second IDT 11b, 12b | Small Pitch Portion | Small Pitch Portion | Third IDT 11c, 12c | Small Pitch Portion | Small Pitch Portion | Fourth IDT 11d, 12d | Small Pitch Portion | Small Pitch Portion | Fifth IDT 11e, 12e |
|---|---|---|---|---|---|---|---|---|---|---|---|---|---|
| Number of Pairs of Electrode Fingers | 15 | 2 | 2 | 3 | 3 | 2 | 2 | 2 | 3 | 3 | 2 | 2 | 15 |
| Electrode Finger Pitch (μm) | 4.321 | 3.892 | 4.247 | 4.159 | 4.237 | 4.079 | 4.141 | 4.079 | 4.237 | 4.159 | 4.247 | 3.892 | 4.321 |

TABLE 2

| | First IDT | Small Pitch Portion | Small Pitch Portion | Second IDT | Small Pitch Portion | Small Pitch Portion | Third IDT | Small Pitch Portion | Small Pitch Portion | Fourth IDT | Small Pitch Portion | Small Pitch Portion | Fifth IDT |
|---|---|---|---|---|---|---|---|---|---|---|---|---|---|
| Number of Pairs of Electrode Fingers | 12 | 2 | 2 | 7 | 3 | 1 | 2 | 1 | 3 | 7 | 2 | 2 | 12 |
| Electrode Finger Pitch (μm) | 4.302 | 4.071 | 3.985 | 4.245 | 4.161 | 3.931 | 4.266 | 3.931 | 4.161 | 4.245 | 3.985 | 4.071 | 4.302 |

Respective electrode finger pitches of the first through fourth reflectors 21 through 24 were set to approximately 4.325 μm, and respective numbers of pairs of electrode fingers thereof were set to approximately 12.5. Likewise, respective electrode finger pitches of the reflectors of the third and fourth longitudinally coupled resonator elastic wave filters 13 and 14 were set to approximately 4.345 μm, and respective numbers of pairs of electrode fingers thereof were set to approximately 14.5.

A LiTaO$_3$ substrate was used as the piezoelectric substrate 9, and a film whose main electrode was made of Pt was deposited while having a total thickness of approximately 343 nm as a metal film for forming the first interconnection layer 25, the IDT electrodes, and so on. The second interconnection layers 26a and 26b were formed by depositing a film whose main electrode was made of an AlCu polycrystal while having a total thickness of approximately 2910 nm.

A width of the elastic wave propagation region, in other words, an intersecting width was set to a value of approximately 76.6 μm, a dimension of the gap 26c along the elastic wave propagation direction was set to approximately 40 μm, and a dimension of the gap 26c in a direction orthogonal to the elastic wave propagation direction was set to approximately 16 μm.

The following settings were made for the serial arm resonator 8.

The number of pairs of electrode fingers of IDT electrodes was 206, an intersecting width was approximately 67.7 μm, and an electrode finger pitch was approximately 3.896 μm. An electrode finger pitch of a reflector was approximately 3.896 μm, and the number of pairs of electrode fingers thereof was 4.5. The same metal was used for the IDT electrodes and the reflectors and with the same or substantially the same film thickness as the first and second longitudinally coupled resonator elastic wave filters 11 and 12.

For comparison, an elastic wave device as a comparative example was manufactured having the same configuration as the elastic wave device discussed above, except that the gap 26c was not provided.

Figure 4:
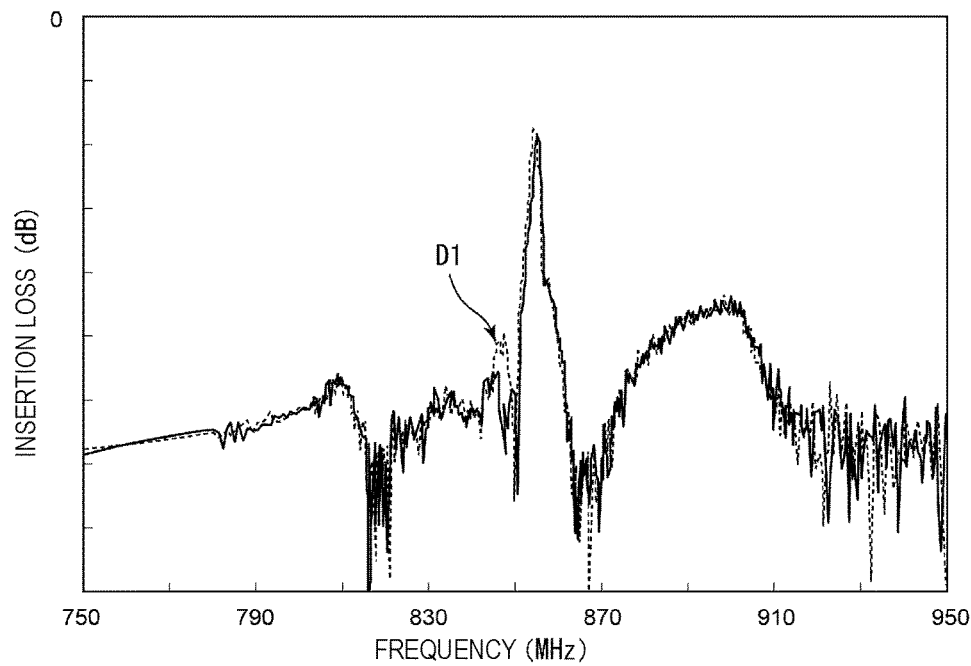
FIG. 4 is a diagram illustrating respective attenuation-frequency characteristics of the reception filter in a preferred embodiment of the present invention and a reception filter of a comparative example.
Figure 5:
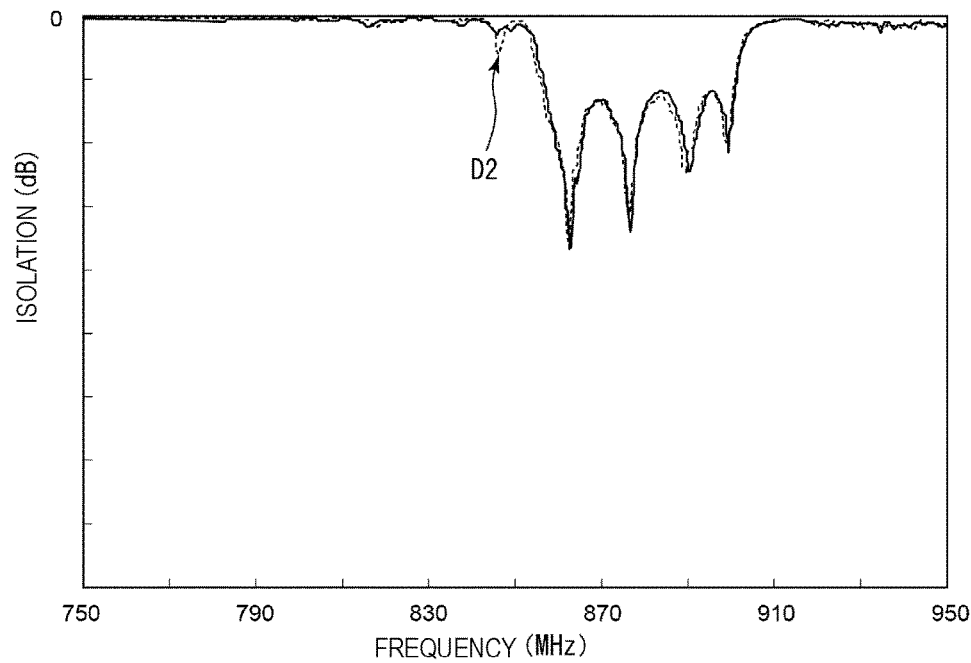
FIG. 5 is a diagram illustrating respective return loss characteristics of the reception filter of the duplexer in a preferred embodiment of the present invention and the reception filter of the comparative example.
Figure 6:
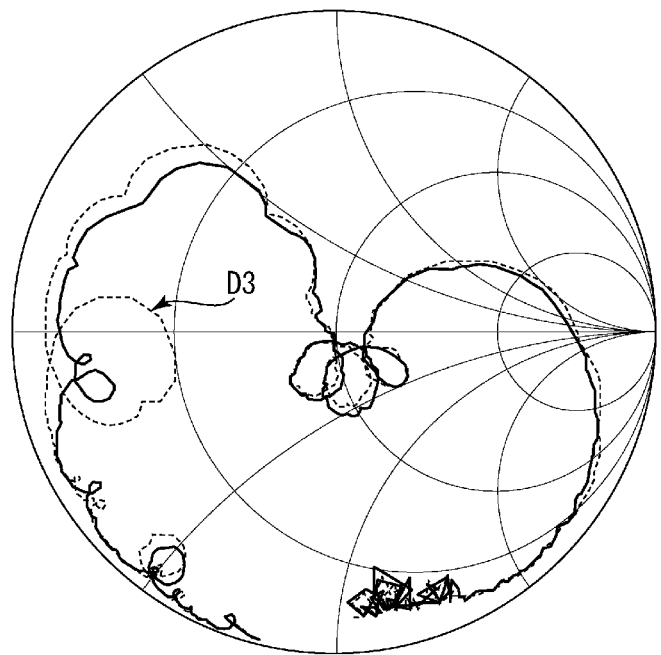
FIG. 6 is a diagram illustrating an impedance Smith chart of the reception filters of a preferred embodiment of the present invention and the comparative example.

Respective attenuation-frequency characteristics of the reception filters of the first preferred embodiment and the comparative example are shown in FIG. 4, and respective return loss characteristics of the reception filters thereof are shown in FIG. 5. FIG. 6 illustrates an impedance Smith chart of the first preferred embodiment and the comparative example. Note that in FIGS. 4, 5, and 6, a solid line indicates a result of the first preferred embodiment, while a broken line indicates a result of the comparative example.

The pass band of the transmission filter 5 preferably is approximately 814 MHz to 849 MHz, and the pass band of the reception filter 6 is approximately 859 MHz to 894 MHz.

In the comparative example, as indicated by arrow marks D1, D2, and D3 in FIGS. 4, 5, and 6, respectively, due to the unwanted modes in an attenuation region on a lower frequency side relative to the pass band of approximately 859 MHz to 894 MHz, the out-of-band attenuation cannot be made to be sufficiently small. In contrast, the out-of-band attenuation is able to be made to be sufficiently large in the first preferred embodiment. As such, according to the first preferred embodiment, including the gap 26c as the different acoustic velocity portion provides a significant reduction in the influence of the unwanted modes. In addition, because it is not necessary to significantly reduce or prevent the unwanted modes by the design of the reflectors, steepness on the lower frequency side of the pass band is provided.

Figure 7:
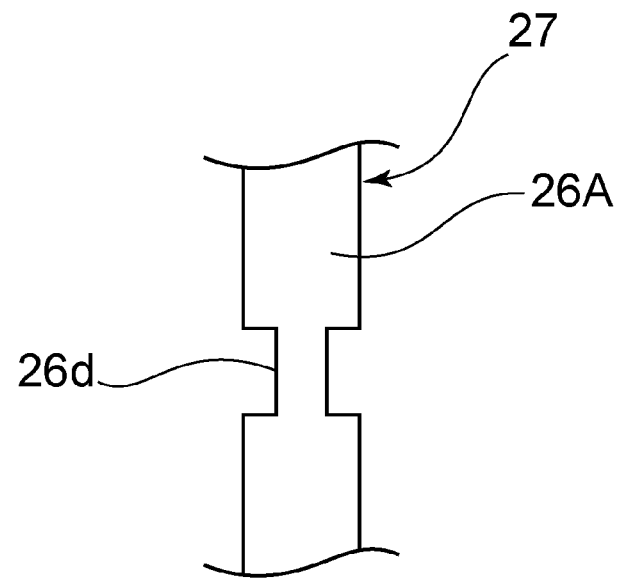
FIG. 7 is a partial cut-out plan view illustrating a first variation of a different acoustic velocity portion of a preferred embodiment of the present invention.

Although the gap 26c is preferably provided to define the different acoustic velocity portion in the first preferred embodiment, other preferred embodiments of the present invention include different implementations for the acoustic velocity portion. For example, as shown in FIG. 7, a small width section 26d whose width is smaller than the remaining section of the second interconnection layer 26A is included in a second interconnection layer 26A of the ground interconnection 27. In this case, a difference in acoustic velocity is generated between an acoustic velocity in the small width section 26d and an acoustic velocity in the portions on both sides of the small width section 26d. As such, providing a different acoustic velocity portion including the small width section 26d causes the unwanted modes to cancel each other out.

Figure 8A:
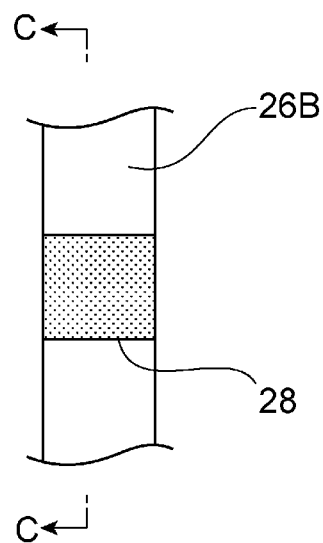
FIG. 8A is a partial cut-out plan view and FIG. 8B is a cross-sectional view of a portion along a C-C line in FIG. 8A for explaining a second variation of a different acoustic velocity portion of a preferred embodiment of the present invention.
Figure 8B:
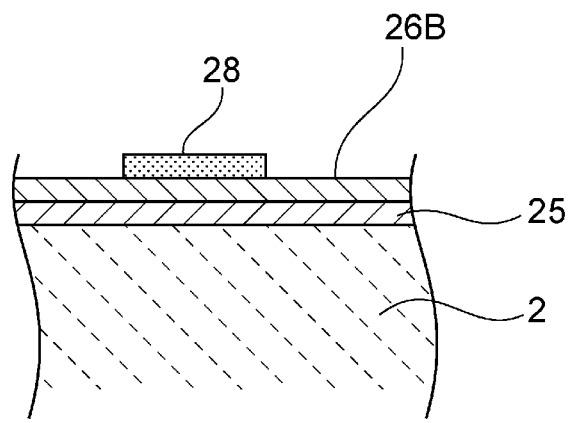

As another example, as shown in FIG. 8A, an acoustic velocity portion is included by laminating a mass addition member 28 on a second interconnection layer 26B. A member made of an appropriate material that adds the mass to lower the acoustic velocity is preferably included as the mass addition member 28. The material included in the second interconnection layer 26A of the ground interconnection 27 preferably includes an inorganic insulation material, such as SiO$_2$ or SiN, or a metal, such as Pt or the like.

According to various preferred embodiments of the present invention, the mass addition member 28 is able to be included along with the gap 26c.

The different acoustic velocity portion is able to be included between the third and fourth longitudinally coupled resonator elastic wave filters 13 and 14. Further, the different acoustic velocity portion is able to be provided both between the first and second longitudinally coupled resonator elastic wave filters 11 and 12 and between the third and fourth longitudinally coupled resonator elastic wave filters 13 and 14.

In the first preferred embodiment, although the first and second longitudinally coupled resonator elastic wave filters 11 and 12 preferably are cited and described as an example of the first and second longitudinally coupled resonator elastic wave elements, other types of longitudinally coupled elastic wave elements may be included.

Further, although the duplexer 1 has been described according to a preferred embodiment to the present invention, a larger number of band pass filters than the duplexer 1 may be included in other preferred embodiments of the present invention. That is, in a multiplexer including a plurality of band pass filters, the above-discussed configuration including the different acoustic velocity portion may be included in at least one of the band pass filters.

Moreover, in an elastic wave apparatus, other than a duplexer, a multiplexer, that includes a plurality of band pass filters, preferred embodiments are able to be applied to a portion where first and second longitudinally coupled resonator elastic wave elements are adjacent to each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate;
    a first longitudinally coupled resonator elastic wave element on the piezoelectric substrate including:
        a first plurality of interdigital transducer (IDT) electrodes;
        a first reflector on a first side in an elastic wave propagation direction of a portion where the first plurality of IDT electrodes are located; and a second reflector disposed on a second side in the elastic wave propagation direction of the portion where the first plurality of IDT electrodes are located;

a second longitudinally coupled resonator elastic wave element that is aligned or substantially aligned with the first longitudinally coupled resonator elastic wave element along the elastic wave propagation direction on the piezoelectric substrate, the second longitudinally coupled resonator elastic wave element including:

a second plurality of IDT electrodes;

a third reflector disposed on a first side in the elastic wave propagation direction of a portion where the second plurality of IDT electrodes are located; and a fourth reflector disposed on a second side in the elastic wave propagation direction of the portion where the second plurality of IDT electrodes are located; and a ground interconnection included on the piezoelectric substrate and electrically connected to the first and second longitudinally coupled resonator elastic wave elements; wherein the second reflector and the third reflector are adjacent to or in a vicinity of each other in the elastic wave propagation direction;

the ground interconnection extends in a direction intersecting with the elastic wave propagation direction and in a region between the second reflector and the third reflector;

the ground interconnection includes a different acoustic velocity portion with an acoustic velocity different from an acoustic velocity in a remaining portion of the ground interconnection, the different acoustic velocity portion being located in a region between the second reflector and the third reflector and overlapping with an elastic wave propagation region of the first and second longitudinally coupled resonator elastic wave elements when viewed in the elastic wave propagation direction; and the ground interconnection includes a first interconnection layer that is continuously connected to the second reflector and the third reflector and that fills the region between the second reflector and the third reflector.

2. The elastic wave device according to claim 1, wherein:

the ground interconnection includes a second interconnection layer in the region between the second reflector and the third reflector that is laminated on the first interconnection layer and not continuously connected to the second or third reflectors; and the different acoustic velocity portion is a portion of the second interconnection layer that includes a dimension along the elastic wave propagation direction smaller than the remaining portion in the second interconnection layer.

3. The elastic wave device according to claim 2, wherein a dimension of the different acoustic velocity portion along the elastic wave propagation direction is 0, and the different acoustic velocity portion includes a gap dividing the second interconnection layer.

4. The elastic wave device according to claim 1, further comprising:

a mass addition member that is at least partially laminated, in a direction intersecting with the elastic wave propagation direction, within a portion of the ground interconnection that at least partially extends to the region between the second reflector and the third reflector and overlaps with the elastic wave propagation region in the elastic wave propagation direction; wherein the mass addition member includes the different acoustic velocity portion.

5. The elastic wave device according to claim 1, wherein the first and second longitudinally coupled resonator elastic wave elements are first and second longitudinally coupled resonator elastic wave filters.

6. The elastic wave device according to claim 5, wherein the elastic wave device is a band pass filter in which the first and second longitudinally coupled resonator elastic wave filters are connected in parallel.

7. The elastic wave device according to claim 5, wherein the first and second longitudinally coupled resonator elastic wave filters are five-IDT longitudinally coupled resonator elastic wave filters.

8. The elastic wave device according to claim 1, wherein the piezoelectric substrate includes a piezoelectric single crystal or at least one piezoelectric film laminated on an insulative substrate.

9. A duplexer comprising:

a reception filter and a transmission filter; wherein at least one of the reception filter and the transmission filter is a band pass filter including the elastic wave device according to claim 1.

10. The duplexer according to claim 9, further comprising:

an antenna terminal; and at least one serial arm resonator including an elastic wave resonator; wherein the at least one serial arm resonator is connected between the elastic wave device and the antenna terminal.

11. The duplexer according to claim 10, wherein the at least one serial arm resonator is included on the piezoelectric substrate.

12. The duplexer according to claim 9, further comprising at least one parallel arm resonator.

13. The duplexer according to claim 9, wherein:

the ground interconnection includes a second interconnection layer in the region between the second reflector and the third reflector that is laminated on the first interconnection layer and not continuously connected to the second or third reflectors; and the different acoustic velocity portion includes a gap dividing the second interconnection layer.

14. A multiplexer comprising:

a plurality of band pass filters, wherein at least one of the plurality of band pass filters includes the elastic wave device according to claim 1.

15. The multiplexer according to claim 14, wherein:

the ground interconnection includes a second interconnection layer in the region between the second reflector and the third reflector that is laminated on the first interconnection layer and not continuously connected to the second or third reflectors; and the different acoustic velocity portion includes a gap dividing the second interconnection layer.

* * * * *